United States Patent [19]

Pichal

[11] 3,825,854

[45] July 23, 1974

[54] AMPLIFIER WITH SUBSTANTIALLY ZERO DISTORTION PRODUCTS

[75] Inventor: Henri T. Pichal, St. Petersburg, Fla.

[73] Assignee: Honeywell Information Systems Inc., Waltham, Mass.

[22] Filed: Oct. 11, 1972

[21] Appl. No.: 296,693

Related U.S. Application Data

[63] Continuation of Ser. No. 96,803, Dec. 10, 1970, abandoned.

[52] U.S. Cl. ........................ 330/149, 330/85, 330/69

[51] Int. Cl. ............................................ H03f 1/26

[58] Field of Search ......... 330/9, 30 D, 69, 85, 149, 330/151; 328/162, 163

[56] References Cited

UNITED STATES PATENTS

| | | | |
|---|---|---|---|
| 2,619,552 | 11/1952 | Kerns | 330/9 |
| 2,709,205 | 5/1955 | Colls | 330/9 |
| 3,525,052 | 8/1970 | Clark | 330/149 |
| 3,603,891 | 9/1971 | Simeau | 330/9 |

FOREIGN PATENTS OR APPLICATIONS

| | | | |
|---|---|---|---|
| 675,268 | 7/1952 | Great Britain | 330/9 |
| 620,140 | 3/1949 | Great Britain | 330/9 |
| 1,278,671 | 11/1961 | France | 330/149 |

*Primary Examiner*—Herman Karl Saalbach
*Assistant Examiner*—James B. Mullins
*Attorney, Agent, or Firm*—Ronald T. Reiling; Nicholas Prasinos

[57] ABSTRACT

An amplifier with substantially zero distortion products is disclosed. A circuit is provided that independently compares the signals in the amplifier output with all the signals provided by the amplifier input source and discriminates between the original signals (fundamentals) and non-original signals (distortion product, spurious signals, and noise, etc.) present in the output terminals of the amplifier or network. Having discriminated and isolated the nonoriginal signals these are then re-inserted back into the amplifier in such phase that provides cancellation of the internally generated products.

8 Claims, 5 Drawing Figures

INVENTOR.
HENRI T. PICHAL
BY Nicholas Prasinos
ATTORNEY

INVENTOR.
HENRI T. PICHAL
BY
Nicholas Prasinos
ATTORNEY

AMPLIFIER WITH SUBSTANTIALLY ZERO DISTORTION PRODUCTS

This is a continuation, of application Ser. No. 96,803, filed Dec. 10, 1970, and now abandoned.

BACKGROUND OF THE INVENTION

The field of this invention is generally amplifiers, and more specifically amplifiers with substantially zero distortion products.

Distortion in low level feedback amplifiers is usually small, and often measured in tenths or one-hundredths of 1 percent with good designs; the distortion will depend to some extent on signal drive level applied. In medium level amplifiers the measure of distortion is more significant, while in high level amplifiers the degree of potential intrinsic distortion generated is at a high level, and often very serious. Furthermore it is customary in communications to employ many sequences or stages to perform an overall function. In conventional Hi-Fi equipment one may find merely a pre-amplifier, tone control unit and main amplifier, while in the other extreme such as an airborne relay or other long distance link (especially a non-radio link, or a radio link where the modulation and re-modulation takes place at each repeater) one finds both low level and high level signals at each repeater; consequently the noise and distortion built up along such a link severely limits the quality of the signal ultimately received at the remote terminal. Because of this the number of repeaters, and hence the range of such a relay is strictly limited. Repeaters provide the amplification necessary to compensate for the attenuation of signals between repeater stations (relays). Each repeater introduces its own contribution of noise and distortion to that already present in the received signal from the previous relay station. The signal then transmitted by the relay contains additional noise and distortion when compared with the signal received from the previous relay. Depending on the quality of the repeater, the number of repeaters possible in a given relay system is limited by the noise and distortion products generated in the repeaters, because ultimately the noise and distortion will "swamp" out the desired signal. Only when signal degradation is reluctantly accepted (because there is no alternative) are long relays employed.

Prior art techniques for reducing distortion products generated within an amplifier include the following:

a. Selection of linear devices (e.g., FET's, Field Effect Transistors)

b. Operation at low efficiency; and c. Application of negative feedback.

The selection of low-noise devices of the early or front-end stages, particularly the low level stages, is simply good design practice, and will entail such devices as FET's, parametric or other low noise amplifiers, or other very sophisticated often quite expensive equipment (e.g., cryogenics). Operation at low efficiency is a technique which purely trades off performance, in order to gain distortion free operation. The most common technique generally utilized is with conventional feedback amplifiers where it is the practice to reduce distortion by increasing the degree of negative feedback. This technique can be better understood by referring to FIG. 1. FIG. 1 shows a prior art amplifier with feedback circuit comprising an amplifier 101 having an open loop gain A, an open loop distortion $D_{01}$ an output signal $E_0$ 103 and an input signal $e_s$ 102 and a feedback loop 104 which is utilized to feedback a fraction $\beta$ of the signal level in the amplifier output back into the input of the amplifier. This prior art amplifier circuit of FIG. 1 will reduce the distortion $D_0$ to a new value $D_f$ given by the following relationship;

$$D_f = D_0\ (1 - A_0\beta)$$

It can be seen that theoretically $D_f$ can be reduced to 0 if $\beta$ is increased to infinity. However under this condition there will be absolutely no gain and indeed in the limit the signal would be completely lost. Hence there are limits to the degree of negative feedback that can be applied and these limits or constraints were established by H. Nyquist who published his results in the Bell System Technical Journal in Jan. 1932 in a paper on Regeneration Theory. From this it can be concluded that negative feedback employed in an amplifier cannot be increased indiscriminately merely to reduce distortion and noise because:

a. the amplification between the input and output terminals will be reduced and eventually become less than useful;

b. the stability of the amplifier will be dangerously impaired.

It is therefore, an object of the invention to provide an improved amplifier.

It is another object of the invention to reduce the distortion products of an amplifier.

It is still another object of the invention to reduce the distortion and spurious products generated within an amplifier so that the closed loop gain is substantially unaffected.

It is still a further object of the invention to virtually eliminate all $l/f$ noise.

SUMMARY OF THE INVENTION

The foregoing objects of the instant invention are attained by providing an amplifier circuit which discriminates between the original or fundamental signals on the non-original signals or the distortion products in the output terminal of the amplifier network and then re-inserting the isolated distortion signals into the amplifier in such a phase that provides cancellation of the internally generated products.

The result of signals at the output of the stage or stages of the amplifier are compared directly with the original (distortion - free) signals that exist at the input terminals and their absolute difference is obtained. This absolute difference taken from the comparison is the true representation of all the distortion and noise products originating from sources that lie between the input and output terminals. These distortion and noise products are re-routed back through the amplifier network, so that through the process of amplification and by virtue of the polarities involved, the effective gain of the amplifier as to the distortion and other unwanted self-generated products is substantially reduced to 0. This is accomplished without any effects upon all the original fundamental or wanted signals coupled into the input terminals from the external source or generator.

A feature of the invention, therefore, is the reduction of distortion and spurious products generated within the amplifier by some means other than increasing the negative feedback, so that the closed loop gain is unaffected.

Another feature of the invention is the virtual elimination of all *l/f* noise, and significant reduction of mid-band gaussian noise and distortion components within the frequency spectrum in which the propagation delay is insignificant when compared with the period of the signal frequency.

Still another feature of the invention is the reduction of noise introduced at very low power levels, such as thermal noise, induced ripple, microphonics, etc., where these are generated within the amplifier. In this case the propagation delay is insignificant, and any band limiting is included only after the early stages.

BRIEF DESCRIPTION OF THE DRAWINGS

Other features and advantages of the invention will become obvious from a consideration of the following description and the claims taken together with the accompanying drawings wherein:

DETAILED DESCRIPTION OF THE INVENTION

Figure 2:
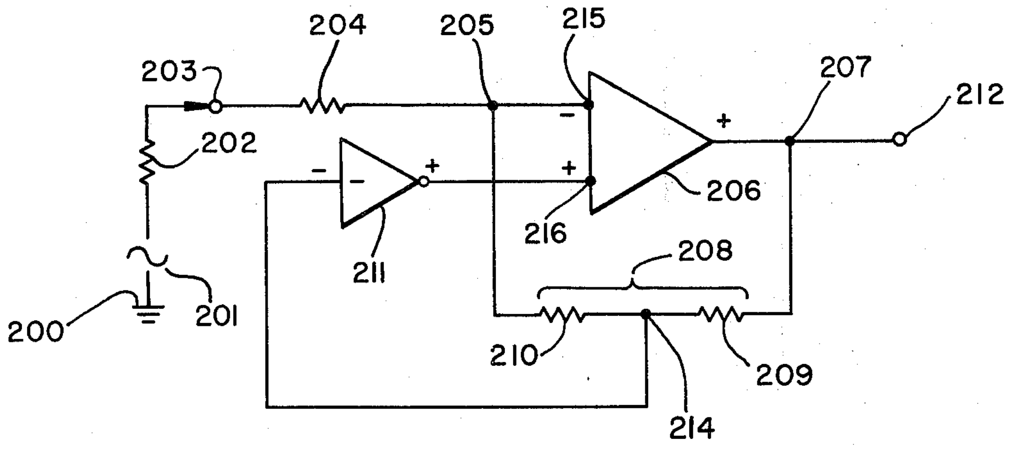
FIG. 2 is a schematic diagram of an embodiment of the invention.

Referring to FIG. 2, there is shown a conventional amplifier 206 or operational amplifier of the type found in amplifier Handbook, Richard F. Shea, Editor-in-Chief, McGraw Hill Book Co. having an open loop gain $A_0$, an output terminal 212 and an input terminal 203. Electric signals are generated by generator 201 having a generator resistance 202 and the signals are applied at input terminal 203. The electric signals are conducted through a resistor 204 into the input 215 of the amplifier 207 and may be abstracted at output terminal 212. A feedback loop having resistor 208 (in conjunction with resistor 204) comprised of the sum of resistors 209 and 210 provides the closed loop gain for the network. If resistor 208 has a value $R_2$ and resistor 204 has a value $R_1$ then the closed loop gain $A_f$ is $R_2/R_1$. The signal taken from the junction 214 of resistor 209 and 210 represents only the distortion generated by the amplifier 206; (see later discussion for details). This portion of the signal is then re-inserted into the input of an inverter 211 which inverts this portion of the signal so that it is 180° out of phase with the input signal introduced at input terminal 203. Both the fundamental and the separated distortion signals are then introduced into amplifier 206 at inputs 215 and 216 respectively. (Although two terminals 215 and 216 are shown in the figure, they may be only one terminal of a conventional amplifier; furthermore the + and − signs indicate phase and not bias.) Since that portion of the signal introduced at input 216 represents the disortion products and is 180° out of phase with the distortion generated within the amplifier, the two equal and opposite signals will cancel out and only the fundamental or desired portion of the input signal will be amplified and available at the output terminal 212.

An operative example will serve to further explain the theory and the application of the invention. The following symbols and values will be used in relation to FIG. 2: resistor 204 is to have a value $R_1$ whereas resistor 208 is to have a value $R_2$; and resistor 209 and 210 are to have values $R_{2F}$ and $R_{2P}$ respectively; fundamental input signal at input terminal 203 has a value designated $E_i$; the amplified output signal at output terminal 212 has a value designated $E_0$; whereas the input electrical signal at amplifier input terminal 215 is designated $e_i$. Assume insignificant generator resistance in resistor 202, a closed loop gain $A_f = E_0/E_i$ for the network of 40 dB, and an open loop gain $A_o$ of the amplifier 206 of 80 dB. Also assume a value of a 1,000 ohms for $R_1$ and 101.02 kilohms for $R_2$. Assume also a value for the second harmonic distortion generated within the amplifier 206 of 1 percent.

Figure 1:
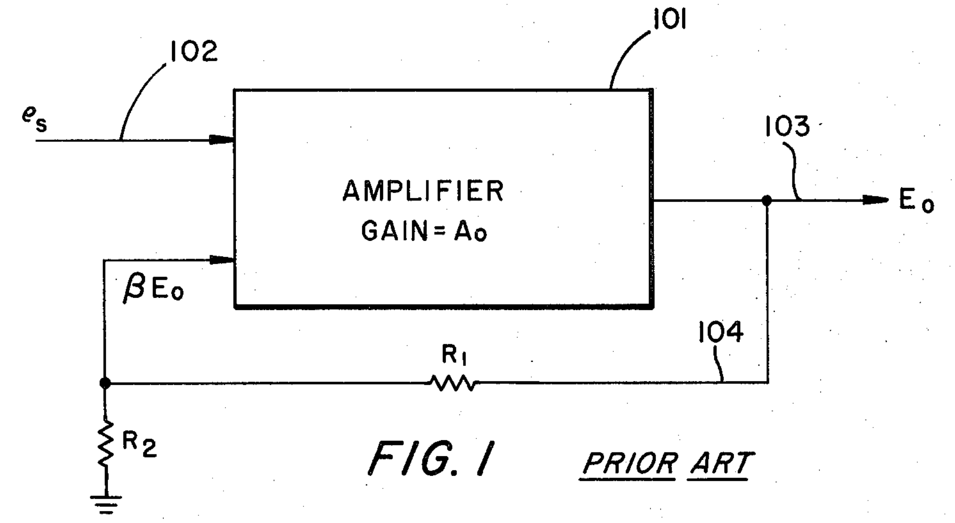
FIG. 1 PRIOR ART
FIG. 1 is a block diagram representation of a prior art amplifier with reduced distortion products.

If a 400 Hz signal $E_i$ of 10 millivolts magnitude is introduced at input terminal 203, an output voltage signal $E_0$ of 1,000 millivolts or 1 volt will appear at output terminal 212 since there is a 40 dB overall close loop gain for this network. ($20 \log E_0/E_i = 40$ or $\log E_0/10 = 2$ or $E_0/10 = 100 \quad E_0 = 1{,}000$) Furthermore since the open loop gain of the amplifier 206 has been selected as 80 dB then the input signal $e_i$ at input terminal 215 will be a 100 microvolts. Furthermore since the amplifier 206 in this instance has a 1 percent distortion that $E_0$ output signal of 1 volt (RMS) at 400 Hz will include 10 millivolts of 800 Hz signal. The 10 millivolts of 800 Hz signal is funneled through resistor 208 $R_2$ in the conventional manner associated with the basic feedback amplifier previously discussed. At the $R_2$ tap 214 the distortion signal in terms of absolute voltage is picked-off. This then is reintroduced into the input terminal 216 of amplifier 206 via inverter 211. The fundamental difference between this and the feedback loop previously discussed in FIG. 1 is that while the prime feedback loop from $E_0$ to $e_i$ establishes the overall closed loop gain, with a pre-determined finite accompanying reduction in distortion, the pick-off from the $R_2$ tap containing no fundamental signal (and hence having no influence on amplifier gain) can be applied (fedback) into the amplifier to counter its source of origin within the amplifier.

The pick-off of the appropriate signal is accomplished in this particular case by dividing resistor 208 into resistors 209 and resistor 210 with resistor 209 having a value of a 101.01 kilohms and resistor 210 having a value of 10.10 ohms. This arrangement acts as a voltage divider where the 10 millivolt, 800 Hz signal is divided at the $R_2$ tap 214 into the proper proportions. It was seen earlier that to produce this 10 millivolts signal at the output 207 a 100 microvolt signal was required at the input 215. It is therefore necessary to produce substantially a 100 microvolts of an inverse signal to be fed into input 216 of the amplifier 206 to counteract the distortion generated in the amplifier. Since the total RMS (800 Hz) current through the resistor chain 209 and 210 is close to 0.09802 microamps, the RMS (800 Hz) signal appearing across the $R_2$ tap 214 is $$ER_2\ (\text{tap}) = (0.0902 \times 10^{-6}) \times (1010.1\ \text{ohms}) = ER_2 = 99.01\ \text{microvolts}.$$

If this 99 microvolts (disregarding the 0.01) of the 800 Hz voltage signal is taken from the $R_2$ tap 214 and fed into the inverter 211 and then into the amplifier 206 at input terminal 216 the resultant 800 Hz inverted signal undergoes amplification equal to the closed loop gain experienced by the fundamental 400 Hz signal at input terminal 203.

In this example, the closed loop gain was chosen to be 40 dB. The actual gain is $R_2/R_1 = 101.0201 \times$ or a little more than 40 dB. This then is the amplification that the 800 Hz signal drawn from the $R_2$ tap will undergo. The resultant 800 Hz signal $E_0$ in the output terminal 212 that will appear simultaneously, but 180° out-of-phase with the original 10 millivolts signal, is 99 microvolts × 101.02010101 - - - = 9.9999 - - - or approximately = 10.000 millivolts This then completes the nullification of the internally generated signal in this example, the second harmonic of the 400 Hz input signal. If the unwanted component being discussed were the third harmonic of 400 Hz signal or 1,200 Hz instead of 800 Hz, the explanation given above would still apply equally well even though the level of the 1,200 Hz component might be a different value. Upon closer inspection it is obvious that the $R_2$ tap 214 is a "zero" signal tap along $R_2$ for the fundamental signal. In essence all of the original or fundamental signals that exist at the input terminal 203 have been filtered out at the $R_2$ null point 214. Null point 214 is a "virtual" ground for all fundamental input frequencies within the overall range of the amplifier system involved. Signals $E_0$ that appear in the output of the amplifier 206 for which there is no fundamental input $E_i$, will not and cannot experience the "virtual" ground at the $R_2$ tap 214. Hence these signals which are products of the amplifier, and not the signal source or generator, do not appear at the $R_2$ tap 214. The $R_2$ tap 214 is singularly unique in that it has enabled all of the distortion components across the full band of operating frequencies to be brought out to one single terminal, while totally excluding all of the original fundamental frequencies.

Figure 3:
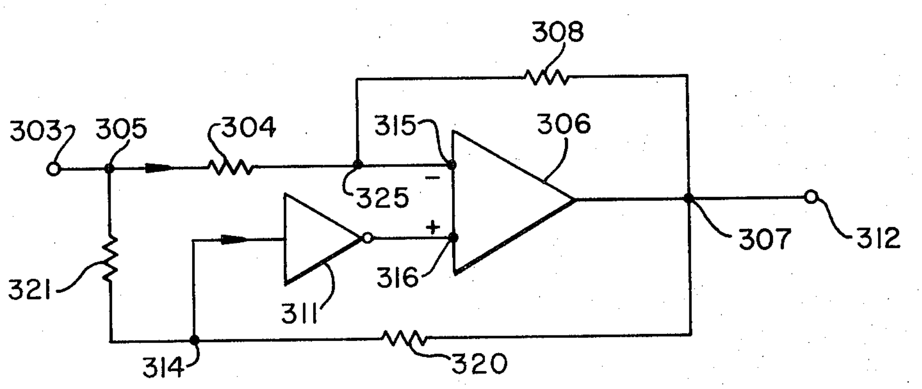
FIG. 3 is a schematic diagram of another embodiment of the invention.

FIG. 3 is another embodiment of the invention which has the advantage of achieving better control and eliminating the effects of "noisy" input currents at the input terminal 315. In this embodiment an amplifier 306 has its input terminal 315 coupled in series to a resistor 304 which in turn is also coupled to a signal input terminal 303. An output terminal 312 for abstracting output signals for amplifier 306 is coupled to amplifier 306 on its output side. Resistor 308 is coupled in parallel with amplifier 306 at junctions 325 and 307. Resistors 320 and 321 are coupled to each other in series and in turn are coupled in parallel across resistor 304 and amplifier 306 at junctions 305 and 307 respectively. An inverter 311 has its output coupled to the input 316 of amplifier 306. Whereas the input of inverter 311 is coupled to a null point 314 between resistors 321 and 320.

In this embodiment if resistor 304 has the value $R_1$, resistor 308 has the value $R_2$, resistor 321 has the value $r_1$, and resistor 320 has the value $r_2$, then as in the previous example if $R_2$ equals $R_{2f} + R_{2P}$, then;

$$r_2 = R_2 - R_{2P} = R2F$$

$$r_1 = R_1 + R_{2P}.$$

For convenience $r_1$, and $r_2$ can be changed from these values provided the same multiplying factor is used for each.

Figure 4:
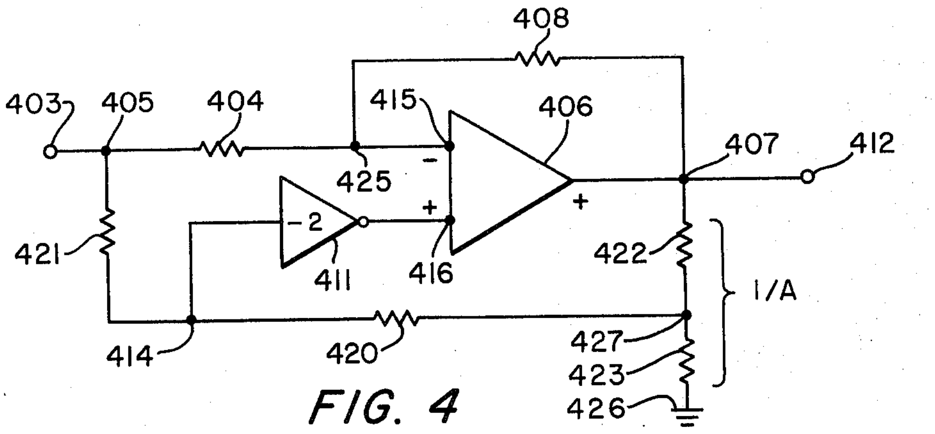
FIG. 4 is a schematic diagram of still another embodiment of the invention.

Still another embodiment of the invention is shown in FIG. 4. Again we have an amplifier 406 having an open loop gain A coupled at its input 415 to a resistor 404 in series with the amplifier 406 and also coupled to the input signal terminal 403. The output end of the amplifier is coupled to output terminal 412. Hence input signals $E_i$ are introduced at input terminal 403 and amplified output signals $E_0$ are abstracted from output terminal 412. A resistor 408 is coupled in parallel to amplifier 406 at junctions 407 and 425. Resistors 421, 420 and 422 are coupled in series to each other, which in turn are coupled in parallel cross amplifier 406 and resistor 404 at junctions 405 and 407 respectively. An inverter 411 has its output coupled to the input 416 of amplifier 406, whereas the input of inverter 411 is coupled to null point junction 414. A resistor 423 is coupled at one end to ground 426 and at its other end to junction 427.

Again assigning the value $R_1$ to resistor 404, $R_2$ to resistor 408, $r_1$ to resistor 421, $r_2$ to resistor 420, $r_3$ to resistor 422, and $r_4$ to resistor 423; and further assigning the value $Q$ as to the gain of inverter 411, and with amplifier 406 having an open loop gain $A_0$ then the following equation holds;

$-Q = [(r_1 + r_2/r_1)/(r_4/r_3 + r_4) \cdot A_0]$ internally

Furthermore the resistors 422 and 423 taken together in series forms an attenuator A, wherein the amplifier output $-AE_i$ is first attenuated typically to equal $E_i$ (or some multiple of $E_i$, in which case this will merely modify the inverter gain required.) The attenuator 1/A determines the gain $-Q$ required in the inverter stage. The simple case is where $r_1 = r_2$; then $Q = 2$. The reason for this is simple. The 1/A attenuator provides a fundamental signal equal to but opposite in sign to $E_i$. At the same time the distortion components of the output of the amplifier have similarly been attenuated. In the $r_i$, $r_2$ network $+E_i$ and the $-E_i$ signal disappear at the junction connected to the inverter, leaving the unwanted distortion components and internaly generated noise. But these latter components have been attenuated in $r_1$, $r_2$. With 0 input generator resistance, and $r_1$ equal to $r_2$, then we have only one-half the level of distortion and noise components coupled into the inverter, that would be required if the inverter gain were −1. That is the $E_D$ and the $E_N$ voltage components at the inverter are equal to $$(E_D + E_N)/[r_1/r_1 + r_2\ ]$$

Were $E_D$ and $E_N$ are the distortion, and noise levels at the outputs of the $r_3$, $r_4$ attenuator.

The gain of the inverter should be made to equal to:

$$Q = \{[r_1 + r_2/r_1]/[(r_4/r_3 + r_4) \times A]\}$$

The arrangement of FIG. 4 generally provides shorter time constants in the loops, by virtue of the smaller resistor values in $r_1$, $r_2$ and the 1/A attenuator can be used. This leads to insignificant loop propagation delays, plus insuring virtual ideal phase relationship.

Figure 5:
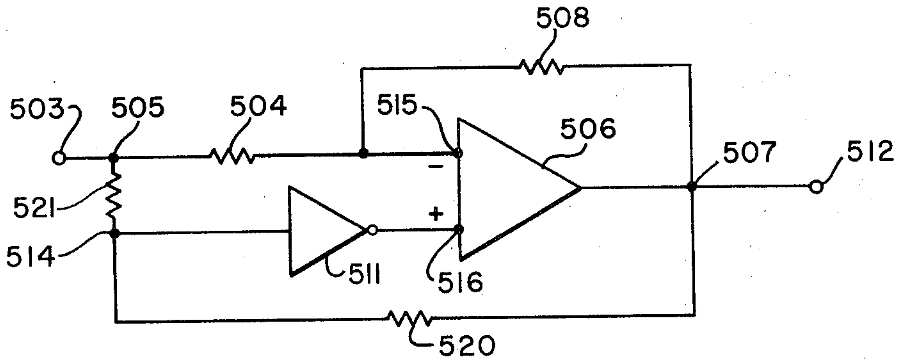
FIG. 5 is yet another embodiment of the invention.

A still further embodiment of the invention is shown in FIG. 5. FIG. 5 shows an amplifier 506 having an input signal terminal 503 and an output signal terminal 512 respectively. Coupled in series between input signal terminal 503 and the input terminal 515 of the amplifier 506 is a resistor 504. A resistor 508 is coupled in parallel across amplifier 506. The resistor 508 is coupled from output terminal 507 to input terminal 515 via resistor 521 and to 504; the gain $A$ is equal to the value of resistor 508 divided by the value of resistor 504. Resistor 521 and 520 are coupled in series with each other and the series connection is coupled in parallel across resistor 504 and amplifier 506 at junction 505 and 507 respectively. An inverter amplifier 511 has its output coupled to the input of amplifier 506 at input terminal

516 whereas the input of inverter 511 is coupled to the fundamental null junction 514.

These and other variations of the embodiment of the invention will become apparent to those sbilled in the art upon a reading of the foregoing specification together with the drawings and claims.

What is claimed is:

1. An amplifier circuit with substantially zero harmonic distortion products comprising:

a. an operational amplifier for amplifying an input signal said amplifier having inverting and non-inverting input terminals and an output terminal said operational amplifier including, coupled to its inverting terminal, a resistor $R_i$, said operational amplifier also internally generating distortion products;

b. resistive discriminator means $R_0$ coupled across said amplifier to said inverting input terminal and to said output terminal, said resistive discriminator means for isolating the distortion products of said amplifier, said resistive discriminator means $R_0$ further cooperating with said resistor $R_i$ for providing closed loop gain $A_f = R_0/R_i$ for said operational amplifier, said resistive discriminator means further comprising at least two predetermined series coupled resistors $r_1$ and $r_2$ coupled across said operational amplifier to said inverting input terminal and to said output terminal, said resistors $r_1$ and $r_2$ for providing at their junction point a voltage signal substantially equal to the distortion products in said amplifier;

c. electronic amplifier inverter means coupled to said resistive discriminator means at the junction point of said series coupled resistors $r_1$ and $r_2$ and also coupled to said non-inverting input terminal of said operational amplifier said electronic amplifier inverter means for inverting with respect to the input signal the phase of the isolated distortion products of said amplifier said phase to be inverted by 180°, whereby said phase-inverted isolated distortion products are continuously applied to the non-inverting input terminal of said operational amplifier.

2. An amplifier network with substantially zero distortion products comprising, a first electrical circuit, a second electrical circuit and a third electrical circuit, and an operational amplifier having an inverting and non-inverting input terminal and an output terminal, said first electrical circuit including a first resistor means said first electrical circuit being coupled to said inverting terminal of said operational amplifier, said second electrical circuit including resistive separator means for separating substantially all the harmonic distortion signal of said operational amplifier from said amplified fundamental signal of said operational amplifier, said resistive separator means also providing negative feedback for said operational amplifier, said resistive separator means also cooperating with said first resistor means for providing a predetermined closed-loop gain for said amplifier network, said second electrical circuit coupled to said output terminal of said operational amplifier and to said inverting terminal, said third electrical circuit including electronic phase inverting means, and wherein said third electrical circuit is coupled to said second electrical circuit and to said non-inverting terminal of said operational amplifier, said electronic phase inverting means for inverting the phase of the separated harmonic distortion signal of said operational amplifier, whereby said harmonic distortion signal is phase inverted and applied to said non-inverting terminal of said operational amplifier.

3. An amplifier circuit as recited in claim 2 including a signal source coupled to said first circuit for introducing an electric signal to said amplifier network, and a signal sink coupled to said first and second circuits for abstracting electric signals from said amplifier network.

4. An amplifier network as recited in claim 3 wherein said separator means comprise impedance elements arranged in a subcircuit comprising separating resistors series-coupled to each other, said series-coupled resistors coupled to said first circuit, said output means of said amplifying means, and to ground, said series-coupled resistors also coupled at their junction to said inverting means, said series coupled resistors being of a predetermined magnitude to cause a voltage drop across one of said series-coupled resistors equal to the amplified input fundamental voltage signal whereby a fundamental signal null point, is caused at the series-coupled resistor junction.

5. An amplifier circuit as recited in claim 4 wherein said third circuit is coupled to said second circuit at the fundamental signal null point.

6. An amplifier network as recited in claim 5 including separating resistors coupled to said second circuit attenuator resistors coupled to said third circuit, and wherein said attenuating resistors have values equal to $r_1$ and $r_2$, said separating resistors have values equal to $r_3$ and $r_4$, said operational amplifier has open loop gain equal to $A_o$, and said inverting means are inverted amplifiers having gain equal to $-Q$ and wherein, $$-Q = [(r_1 + r_2/r_1)/(r_4/r_3 + r_4) \cdot A_o ].$$

7. An amplifier network as recited in claim 6 wherein said first impedance element has a value $R_2$ and said second impedance element has a value $R_1$, and said first electriccal circuit has closed loop gain equal to $A_f$ and wherein, $$A_f = -(R_2/R_1) .$$

8. A method of eliminating harmonic distortion products in a D.C. amplifier network comprising the steps of:

a. applying a fundamental electric signal into said D.C. amplifying network;

b. amplifying the fundamental electric signal in said D.C. amplifying network;

c. comparing the undistorted input signal with the distorted output signal;

d. abstracting substantially all the distortion signal from said D.C. amplifying network by a single stage resistive electric circuit;

e. inverting the phase of the distortion signal; and f. reinserting the inverted distortion signal into the input of said D.C. amplifying network.

* * * * *